(12) United States Patent
Ramian et al.

(10) Patent No.: US 11,474,137 B2
(45) Date of Patent: Oct. 18, 2022

(54) TEST SYSTEM

(71) Applicant: Rohde & Schwarz GmbH & Co. KG, Munich (DE)

(72) Inventors: Florian Ramian, Munich (DE); Werner Held, Munich (DE); Johannes Steffens, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 0 days.

(21) Appl. No.: 17/025,676

(22) Filed: Sep. 18, 2020

(65) Prior Publication Data
US 2022/0094453 A1 Mar. 24, 2022

(51) Int. Cl.
*G01R 27/28* (2006.01)
*H04B 17/309* (2015.01)

(52) U.S. Cl.
CPC .......... *G01R 27/28* (2013.01); *H04B 17/309* (2015.01)

(58) Field of Classification Search
None
See application file for complete search history.

(56) References Cited

U.S. PATENT DOCUMENTS

| | | | | |
|---|---|---|---|---|
| 4,149,122 A | * | 4/1979 | Parato | H04B 17/20 455/226.1 |
| 4,769,592 A | * | 9/1988 | Potter | G01R 27/06 324/638 |
| 4,896,096 A | * | 1/1990 | Ewart | G01R 27/28 324/637 |

(Continued)

FOREIGN PATENT DOCUMENTS

| | | | | |
|---|---|---|---|---|
| GB | 2347754 A | * | 9/2000 | ............ G01R 27/06 |
| GB | 2382662 A | * | 6/2003 | ............ G01R 27/28 |

(Continued)

OTHER PUBLICATIONS

Verspecht, J., et al., "Network Analysis Beyond S-parameters: Characterizing and Modeling Component Behaviour under Modulated Large-Signal Operating Conditions," 30th European Microwave Conference, Oct. 2000, 4 pages.

(Continued)

*Primary Examiner* — Gennadiy Tsvey
(74) *Attorney, Agent, or Firm* — Christensen O'Connor Johnson Kindness PLLC

(57) ABSTRACT

A test system for testing a device under test having at least an input port and an output port. The test system comprising a vector signal generator, a switch, a directional element, and a vector signal analyser. The vector signal generator, depending on the respective switching position of the switch, is connected with the input port of the device under test or the output port of the device under test such that, in a first switching position of the switch, the wideband modulated signal generated by the vector signal generator is forwarded to the input port and, in a second switching position of the switch, the wideband modulated signal generated by the vector signal generator is forwarded to the output port. The switch is configured to enable the vector signal analyser to perform reflection measurements and transmission measurements depending on the respective switching position of the switch.

19 Claims, 2 Drawing Sheets

(56) References Cited

U.S. PATENT DOCUMENTS

| | | | | |
|---|---|---|---|---|
| 4,982,164 | A * | 1/1991 | Schiek | G01R 35/005 324/638 |
| 5,097,215 | A * | 3/1992 | Eul | G01R 27/28 324/638 |
| 5,146,171 | A * | 9/1992 | Bradley | G01R 31/2822 324/637 |
| 5,313,166 | A * | 5/1994 | Eul | G01R 35/005 702/85 |
| 5,467,021 | A * | 11/1995 | Adamian | G01R 35/005 324/650 |
| 5,524,281 | A * | 6/1996 | Bradley | G01R 27/28 455/67.15 |
| 6,018,246 | A * | 1/2000 | Dunsmore | G01R 27/28 324/76.27 |
| 6,081,125 | A * | 6/2000 | Krekels | G01R 27/32 324/638 |
| 6,397,160 | B1 * | 5/2002 | Craig | G01R 31/3167 702/120 |
| 6,496,785 | B1 * | 12/2002 | Nakayama | G01R 27/28 702/117 |
| 6,606,583 | B1 * | 8/2003 | Sternberg | G01R 35/005 702/191 |
| 7,830,217 | B1 * | 11/2010 | Stein | H04L 27/365 332/103 |
| 7,919,969 | B2 * | 4/2011 | Held | G01R 23/14 324/638 |
| 10,281,510 | B1 * | 5/2019 | Tsironis | G01R 31/2822 |
| 10,379,162 | B1 * | 8/2019 | Okuyama | G01R 27/32 |
| 10,805,015 | B1 * | 10/2020 | Dressel | G01R 27/32 |
| 10,890,604 | B2 * | 1/2021 | Huang | G01R 31/2841 |
| 2004/0233980 | A1 * | 11/2004 | Kernchen | G01R 31/31708 375/224 |
| 2005/0240852 | A1 * | 10/2005 | Inaba | G01R 31/3167 714/740 |
| 2006/0005065 | A1 * | 1/2006 | Nakayama | G01R 27/28 714/4.1 |
| 2007/0030065 | A1 * | 2/2007 | Heinikoski | H03F 1/3241 330/149 |
| 2007/0194776 | A1 * | 8/2007 | Bossche | G01R 27/28 324/76.22 |
| 2007/0236230 | A1 * | 10/2007 | Tanbakuchi | G01R 31/2841 324/650 |
| 2007/0285108 | A1 * | 12/2007 | Nakayama | G01R 27/28 324/615 |
| 2008/0211515 | A1 * | 9/2008 | Mori | G01R 27/28 324/638 |
| 2009/0092177 | A1 * | 4/2009 | Dvorak | H04B 17/101 375/224 |
| 2009/0184721 | A1 * | 7/2009 | Albert-Lebrun | G01R 27/32 324/601 |
| 2013/0093434 | A1 * | 4/2013 | Peyton | H04M 3/34 324/628 |
| 2013/0250781 | A1 * | 9/2013 | Gilmartin | H04B 17/20 370/250 |
| 2015/0048868 | A1 * | 2/2015 | Zhao | H03B 23/00 327/113 |
| 2017/0227622 | A1 * | 8/2017 | Aydin | G01R 27/28 |
| 2017/0272431 | A1 * | 9/2017 | Villarino-Villa | H04B 17/309 |
| 2018/0074180 | A1 * | 3/2018 | Wu | G01S 7/03 |
| 2020/0103458 | A1 | 4/2020 | Anderson et al. | |
| 2020/0103485 | A1 * | 4/2020 | Anderson | G01R 35/00 |

FOREIGN PATENT DOCUMENTS

| | | | | |
|---|---|---|---|---|
| WO | WO-0203602 A1 * | 1/2002 | | H03F 1/3294 |
| WO | WO-0223212 A1 * | 3/2002 | | B82Y 30/00 |
| WO | 2019/051300 A1 | 3/2019 | | |

OTHER PUBLICATIONS

Angrisani, L., "Experimental Assessment of Modulated S-Parameters Reliability in Modeling and Testing Wideband Radio Frequency Amplifiers," IEEE Transactions on Instrumentation and Measurement 55(5):1474-1479, Oct. 2006.

Arshad, N.S.A., et al., "QPSK Modulation Using Multi-Pod Device," IEEE Symposium on Wireless Technology and Applications (ISWTA), Sep.-Oct. 2014, 6 pages.

* cited by examiner

TEST SYSTEM

FIELD OF THE DISCLOSURE

The present disclosure relates to a test system for testing a device under test having an input port and an output port.

BACKGROUND

Nowadays, many electronic devices that process electromagnetic signals have to be tested with regard to different characteristics. In the state of the art, test systems are known that are used to test a device under test that has an input port and an output port, namely a so-called 2-port device. For instance, scattering parameters (S-parameters) are measured which describe the electrical behaviour of the device under test when undergoing various steady state stimuli. These scattering parameters can be used for performing a port matching measurement of the device under test.

Typically, at least two different measurement setups are required to perform these different measurements. For instance, a first measurement setup comprises a vector network analyser (VNA) that is used to measure a port matching of the respective device under test, namely measuring the respective port matching parameters of the device under test. The port matching measurement is typically done by means of an approach based on a continuous wave (CW) signal. Moreover, a second measurement setup may be used to test the respective device under test, which comprises a vector signal generator (VSG) and a vector signal analyser (VSA). The respective parameters obtained by means of the second measurement setup may be used for determining an adjacent channel leakage power ratio (ACLR) or an error vector magnitude (EVM).

Generally, ACLR defines the ratio of transmitted power on an assigned channel to power received in an adjacent channel EVM is a measure to quantify the performance of the electronic device to be tested, particularly a receiver or a transmitter.

Accordingly, the test systems known so far have different setups in order to perform the respective measurements of interest, for instance the scattering parameter (S-parameter) measurements and the measurements concerning modulation accuracy, namely error vector magnitude (EVM) measurements, spur measurements and/or adjacent channel leakage power ratio (ACLR) measurements.

In order to perform all these different measurements, it is necessary to use several different measurement setups of the test system which in turn requires manual interaction, as the signal generators and/or signal analysers have to be connected via respective cables differently in order to establish the different measurement setups of the test system. Since the manual interaction results in additional efforts and therefore costs related therewith, there is an industry trend towards performing the respective measurements with at least the same connection of the device under test, preferably the same entire measurement setup. However, this trend can only be achieved by test systems that are complex and therefore expensive.

Accordingly, there is a need for a test system that can be used to perform the respective measurements at low costs and with less efforts compared to the ones known in the state of the art.

SUMMARY

The present disclosure provides examples of a test system for testing a device under test having at least an input port and an output port. In an embodiment, the test system comprises a vector signal generator circuit configured to generate a wideband modulated signal, a switch circuit or module having different switching positions, a directional element configured to separate incident electromagnetic waves and reflected electromagnetic waves, and a vector signal analyser circuit configured to analyse a signal received. The switch module is connected with the vector signal generator circuit. The directional element is connected with the input port or the output port of the device under test. The vector signal generator circuit, depending on the respective switching position of the switch module, is connected with the input port of the device under test or the output port of the device under test such that, in a first switching position of the switch module, the wideband modulated signal generated by the vector signal generator circuit is forwarded to the input port of the device under test and, in a second switching position of the switch module, the wideband modulated signal generated by the vector signal generator circuit is forwarded to the output port of the device under test. The switch module is configured to enable the vector signal analyser circuit to perform reflection measurements and transmission measurements depending on the respective switching position of the switch module.

The present disclosure is based on the finding that the test system can be simplified by using a switch module that ensures directing the wideband modulated signal to the respective port of the device under test in order to perform the measurement intended. Accordingly, the switch module is set into its respective switching position that ensures routing the wideband modulated signal appropriately, namely to the port that shall receive the wideband modulated signal. The switch module may also ensure that the signal processed by the device under test or rather reflected at the respective port of the device under test, namely the input port or rather the output port, is routed towards the vector signal analyser circuit for being analysed appropriately. Therefore, the switch module generally ensures that the vector signal analyser circuit is enabled to perform reflection and/or transmission measurements, wherein this depends on the respective switching position of the switching module when performing the respective measurement. Put differently, the signal received by the vector signal analyser circuit corresponds to a signal reflected at the input port of the device under test, a signal reflected at the output port of the device under test or a signal processed by the device under test. In some embodiments, the signal processed by the device under test may relate to a signal forwarded to the input port and outputted at the output port or rather a signal forwarded to the output port and outputted at the input port.

Generally, the switch module allows to implement an N-port analysing functionality even though only a single port of the vector signal analyser circuit is used due to the switch module and its different switching positions. Therefore, the overall costs of the test system can be reduced significantly even though it is possible to use a single measurement setup for performing the different measurements due to the switch module and its different switching positions.

The test system may comprise only a single vector signal generator (VSG) circuit and/or only a single vector signal analyser (VSA) circuit. Thus, the vector signal generator (VSG) circuit corresponds to a single vector source and the vector signal analyser (VSA) circuit corresponds to a single vector receiver. Hence, the test system provides a multi-port vector network analysing functionality.

In general, the test system may also comprise the device under test having the input port and the output port. The device under test is (at least indirectly) connected with the vector signal generator circuit and the vector signal analyser circuit, wherein the directional element and the switch module are located between the vector signal generator circuit and the vector signal analyser circuit. In other words, at least one signal path is established between the vector signal generator circuit and the vector signal analyser circuit, wherein the switch module and the directional element are interposed between the vector signal generator circuit and the vector signal analyser circuit.

The directional element is connected with any port where S-parameters are measured. In some embodiments, if only $S_{11}$ and/or $S_{21}$ measurements are intended, it is not necessary to connect the output port with a directional element. Hence, the cabling can be optimized to reduce insertions loss.

An aspect provides that the switch module has a third switching position in which the vector signal generator circuit is connected with the vector signal analyser circuit such that a reference signal is directly forwarded from the vector signal generator circuit towards the vector signal analyser circuit. The reference signal directly forwarded to the vector signal analyser circuit may correspond to a radio frequency signal that has been generated by the vector signal generator circuit. Thus, a reference signal path is provided between the vector signal generator circuit and the vector signal analyser circuit, wherein the switch module is located within the reference signal path such that the reference signal can be forwarded to the vector signal analyser circuit provided that the switch module is set in its third switching position. The direct forwarding of the reference signal means that the reference signal is not processed by the device under test.

Accordingly, the reference signal can be used as a reference for the signal processed by the device under test.

Alternatively or additionally, a reference signal is digitally transferred from the vector signal generator circuit towards the vector signal analyser circuit. For instance, a local area network (LAN) interface is provided via which the reference signal can be digitally transferred. Hence, the digitally transferred reference signal may correspond to a data file that is transferred. The data file is used by the vector signal generator circuit for generating the wideband modulated signal that is used by the test system for testing the device under test. The vector signal analyser circuit receives and processes the data file such that the reference signal is obtained accordingly.

The reference signal may be generally used to perform EVM measurements of the device under test.

In some embodiments, the reference signal is taken into account in order to identify any imperfections in the device under test (such as carrier leakage, low image rejection ratio, phase noise etc.) which cause actual constellation points to deviate from the ideal locations.

The reference signal may be used as a phase reference. However, the phase reference is not necessary in case that perfectly stable devices are provided or rather tested. However, the reference signal enables tracking of the behaviour of the system, for instance phase or other characteristics, for a longer time so that system error correction is valid for a longer time even though phase relation or other system parameters may change.

Further, the reference signal may be used as a frequency reference. Thus, the vector signal generator circuit and the vector signal analyser circuit can be frequency locked appropriately. Alternatively, any frequency offset could be compensated with signal processing algorithms. The frequency offset does not have to be known if the reference signal is known.

Another aspect provides that at least one of the vector signal generator circuit and the vector signal analyser circuit comprises a memory. In other words, the vector signal generator circuit may comprise an integrated memory. Alternatively or additionally, the vector signal analyser circuit may comprise an integrated memory. The respective memory may be used to store the data file encompassing data for generating the wideband modulated signal used for testing the device under test. Hence, the vector signal generator circuit has a memory in which the data file is stored which is accessed when generating the wideband modulated signal. The vector signal analyser circuit may comprise a memory for storing the digitally transferred data file that is processed by the vector signal analyser circuit in order to obtain the wideband modulated signal.

Moreover, the vector signal analyser circuit may be configured to determine at least one scattering parameter associated with the device under test. Since the device under test may generally have any number of (analogue) ports, for example the input port and the output port, the device under test may correspond to a two-port device, for instance. However, the device under test may also correspond to a three-port device, a four-port device and so on. Therefore, the scattering parameters correspond to two-port scattering parameters (2-port S-parameters) that describe generally the input port reflection coefficient ($S_{11}$), the reverse gain ($S_{12}$), the forward gain ($S_{21}$), and the output port reflection coefficient ($S_{22}$). Since the switch module and the directional element are provided, the test system is enabled to measure all of the different scattering parameters mentioned above.

If necessary, the directional element may be positioned differently such that the directional element is connected with the input port of the device under test or rather the output port of the device under test.

Another aspect provides that the vector signal generator circuit forwards the wideband modulated signal to the device under test via the directional element, wherein the directional element is configured to separate an electromagnetic wave reflected at the input port of the device under test or at the output port of the device under test. This generally depends on the respective location of the directional element with respect to the device under test, for example the respective port of the device under test.

If the directional element is connected with the input port of the device under test, the directional element is configured to separate electromagnetic waves reflected at the input port. If the directional element is connected with the output port of the device under test, the directional element is configured to separate electromagnetic waves reflected at the output port of the device under test.

Furthermore, the test system may have a first operation mode in which the vector signal generator circuit forwards the wideband modulated signal to the input port of the device under test via the directional element, wherein the directional element is configured to separate an electromagnetic wave reflected at the input port of the device under test. In the first operation mode, $S_{11}$ measurements as well as $S_{21}$ measurements can be performed. When performing the $S_{11}$ measurements, the directional element is used to separate the electromagnetic wave reflected at the input port of the device under test.

The test system may have a second operation mode in which the vector signal generator circuit forwards the wideband modulated signal to the output port of the device under test via the directional element, wherein the directional element is configured to separate an electromagnetic wave reflected at the output port of the device under test. In the second operation mode, $S_{22}$ measurements as well as $S_{12}$ measurements can be performed. When performing the $S_{22}$ measurements, the directional element is used to separate the electromagnetic wave reflected at the output port of the device under test.

The switch module may be detachably coupled such that the switch module is configured to be connected with the vector signal generator circuit and the vector signal analyser circuit. The switch module may be established by two switches that can be connected with the vector signal generator circuit and the vector signal analyser circuit simultaneously.

Further, the directional element may be detachably coupled such that the directional element is configured to be connected with either the input port of the device under test or the output port of the device under test. As mentioned above, the directional element can be used for performing different scattering parameter measurements depending on the respective position of the directional element with respect to the device under test, namely its ports.

Another aspect provides that the test system comprises two directional elements, wherein a first directional element is connected with the input port of the device under test, and wherein a second directional element is connected with the output port of the device under test. Accordingly, it is not necessary to re-position the respective directional element for performing all S-parameter measurements since the directional elements are always connected with both ports of the device under test. Incident electromagnetic waves as well as reflected electromagnetic waves can be separated with respect to the input port and the output port of the device under test in an appropriate manner. No manual interaction is required for re-positioning the directional element(s).

Furthermore, the switch module may comprise a first switch connected with the vector signal generator circuit and a second switch connected with the vector signal analyser circuit. Accordingly, the switch module is established by two separately formed switches that are also assigned to the input port of the device under test and the output port of the device under test respectively while being connected with the vector signal generator circuit and the vector signal analyser circuit.

Therefore, it is not necessary to re-position the switch module, for example the single switch, in order to perform the different measurements, as it is ensured that the different signals can be routed in an appropriate manner due to the two differently positioned switches that are assigned to the vector signal generator circuit and the vector signal analyser circuit.

The first switch may be connected with a first directional element connected with the input port of the device under test and/or the second switch is connected with a second directional element connected with the output port of the device under test. Depending on the respective switching position of the switches, the signal can be routed in an appropriate manner.

For instance, the first switch has three different switching positions that ensure to route the wideband modulated signal (via the first directional element) to the input port of the device under test in a first switching position, to route the wideband modulated signal (via the second directional element) to the output port of the device under test in a second switching position, and to route the reference signal directly to the vector signal analyser circuit in a third switching position without routing the wideband modulated signal trough the device under test.

In a similar manner, the second switch may also have three different switching positions, wherein the second switch connects the vector signal analyser circuit with the output port of the device under test (via the first directional element) in a first switching position, to connect the vector signal analyser circuit with the input port of the device under test (via the second directional element) in the second switching position, and to connect the vector signal analyser circuit directly with the vector signal generator circuit in a third switching position such that the reference signal can be exchanged directly.

In addition, a trigger line may be established between the vector signal generator circuit and the vector signal analyser circuit. Via the trigger line, a command or rather time may be issued at which the vector signal generator circuit starts its transmission. Accordingly, group delay and/or phase delay measurements of the device under test can be performed.

In addition, a communication interface between the vector signal generator circuit and the vector signal analyser circuit may be provided. The communication interface can be used to coordinate frequency stitching for the vector signal analyser circuit or the vector signal generator circuit, for example in case of a bandwidth being less than the span of the measurement intended. For instance, the vector signal generator circuit is limited with regard to the bandwidth such that the device under test cannot be loaded with a full signal. Hence, the entire bandwidth used for the respective measurement based on the wideband modulated signal is stepped through different bands over time. This stepping and stitching of the several bands can be coordinated via the communication interface appropriately.

Moreover, the test system is configured to perform an error vector magnitude (EVM) measurement. As mentioned above, the reference signal (transferred digitally or rather in the third switching position of the switch module) may be used for the EVM measurement(s).

Furthermore, the test system is configured to perform spur measurements and/or adjacent channel leakage power ratio measurements. Accordingly, any occurring spurs can be identified when performing respective measurements with the test system. In some embodiments, the spurs can be identified by the vector signal analyser circuit accordingly. In a similar manner, the vector signal analyser circuit is used to identify any power received in an adjacent channel.

According to another aspect, the vector signal analyser circuit is a single-port vector signal analyser circuit. The single-port vector signal analyser circuit is enlarged with respect to its functionality due to the fact that the switch module ensures that the single-port vector signal analyser circuit can perform reflection measurements and transmission measurements due to the different switching positions of the switch module.

In some embodiments, the switching allows two or more port device under tests to be measured on a one-port vector signal analyser circuit. Generally, such a test system is a cheaper compared to a test system having two or more vector signal analyser circuits.

Generally, the device under test may have a number of ports unequal 2. Hence, the device under test may be a 1-port, 3-port or 4-port device. In some embodiments, the device under test may have N ports, wherein N is a number equal or higher than 1.

Accordingly, the device under test may be an analog-to-digital device or a digital-to-analog device. In some embodiments, the device under test is established as an RF-to-digital device comprising an analog input, or as a digital-to-RF device comprising a digital input.

Therefore, the vector signal generator circuit may be configured to generate a digital instruction signal or an analogue stimulus signal for the device under test. In the case of generating the analogue stimulus signal by the vector signal generator circuit, the directional element is configured to forward the analogue stimulus signal from the vector signal generator circuit to the device under test, wherein the device under test is configured to generate a digital output signal based on the analogue stimulus signal received, and wherein the digital output signal is forwarded to the vector signal analyser circuit. In the case of generating the digital instruction signal by the vector signal generator circuit, the device under test is configured to generate an analogue output signal based on the digital instruction signal received, wherein the directional element is configured to forward the analogue output signal generated to the vector signal analyser circuit. The vector signal analyser circuit is configured to determine at least one characteristic parameter of the device under test, for instance S-parameter(s), based on the analogue output signal of the device under test or the digital output signal of the device under test.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
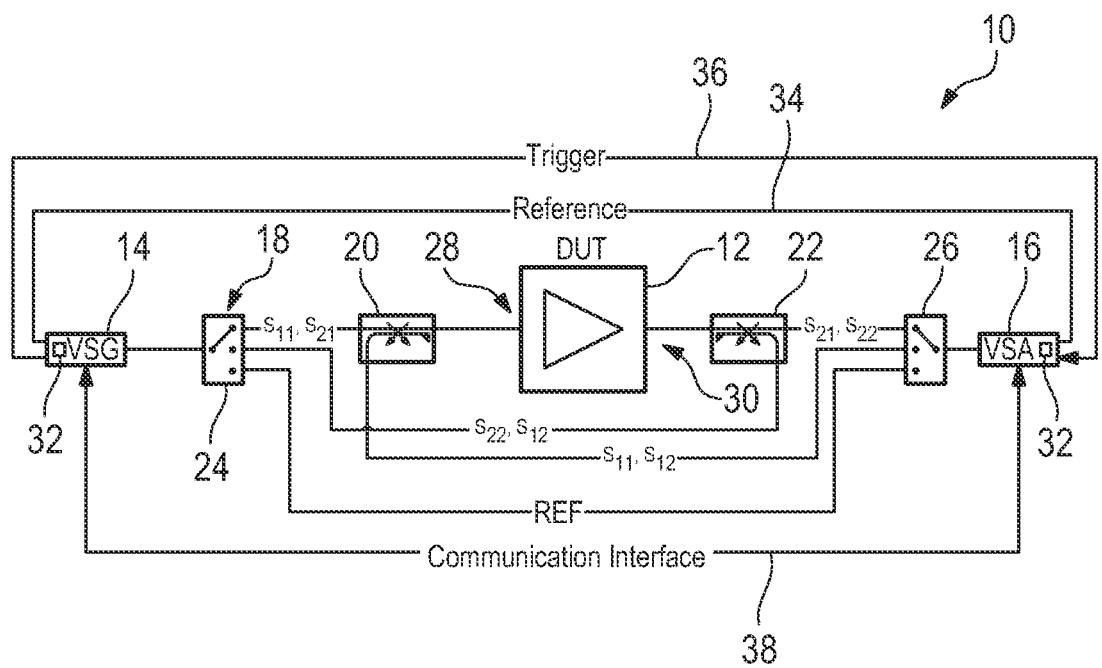
FIG. 1 schematically shows a representative overview of a test system according to a first embodiment of the present disclosure.

In FIG. 1, a test system 10 is shown that is used to test a device under test 12. The test system 10 comprises a vector signal generator (VSG) 14 comprising one or more circuits, a vector signal analyser (VSA) 16 comprising one or more circuits, a switch circuit or module 18 as well as at least one directional element 20. In an embodiment, the at least one directional element, such as a first directional element 20, comprises one or more circuits.

In the embodiment shown in FIG. 1, the test system 10 has a first directional element 20 as well as a second directional element 22 such that two directional elements 20, 22 are provided in total. Moreover, the switch module 18 is established by two separate switches 24, 26 that are associated with the vector signal generator 14 and the vector signal analyser 16, respectively. The respective switches 24, 26 are preferably non-mechanical ones.

In general, the vector signal generator 14 is configured to generate a wideband modulated signal that is forwarded to the vector signal analyser 16 in order to be analysed by the vector signal analyser 16 that receives the respective signal.

The signal received by the vector signal analyser 16 may have been processed previously by the device under test 12 such that characteristics of the device under test 12 can be determined appropriately. However, the vector signal generator 14 may also directly forward the wideband modulated signal towards the vector signal analyser 16. Generally, this depends on the switching position of the switch module 18 as will be described later in more detail.

The directional elements 20, 22 ensure that the vector signal analyser 16 is able to perform reflection measurements and transmission measurements of the device under test 12 that has an input port 28 as well as an output port 30.

In some embodiments, the directional elements 20, 22 are configured to separate incident electromagnetic waves and reflected electromagnetic waves associated with the respective ports 28, 30 of the device under test 12 such that the directional elements 20, 22 can be used for performing scattering parameter measurements (S-parameter measurements).

As shown in FIG. 1, the first directional element 20 is connected with the input port 28 of the device under test 12, whereas the second directional element 22 is connected with the output port 30 of the device under test 12. The first switch 24 of the switch module 18 is also connected with the first directional element 20, whereas the second switch 26 is connected with the second directional element 22.

However, the respective switches 24, 26 have different switching positions such that the first switch 24 is connected with the vector signal generator 14 via the first side of the first switch 24 and with the first directional element 20, the second directional element 22 and the second switch 26 via its second side.

Further, the second switch 26 is connected with the vector signal analyser 16 via the second side of the second switch 26 and with the second directional element 22, the first directional element 20 and the first switch 24 of the switch module 18 via its first side.

Accordingly the switch module 18, for example the respective switches 24, 26 has different switching positions that are used to perform different measurements.

If both switches 24, 26 are set in their respective third switching position, the switch module 18 is in its third switching position, in which a direct connection (via the switch module 18 or rather the switches 24, 26) is established between the vector signal generator 14 and the vector signal analyser 16. The direction connection is used for transferring the wideband modulated signal directly, namely as a reference signal.

In addition, the vector signal generator 14 and/or the vector signal analyser 16 have/has a memory 32. The memory 32 is integrated in the respective device.

Generally, the memory 32 is used to store a data file that can be used by the vector signal generator 14 for generating the wideband modulated signal. With respect to the vector signal analyser 16, the memory 32 is used to store a data file received from the vector signal generator 14.

For this purpose, a digital reference line 34 is established between the vector signal generator 14 and the vector signal analyser 16 in order to digitally transfer the reference signal by a data file that is exchanged accordingly.

Hence, the reference signal is exchanged by transmitting the data file encompassing information concerning the wideband modulated signal. The data file received is internally processed by the vector signal analyser 16 in order to obtain the wideband modulated signal that is generated by the vector signal generator 14 for testing the device under test 12. By processing the respective data file, the vector signal analyser 16 is generally enabled to obtain the reference signal that can be used for determining respective characteristics of the device under test 12 accurately, for example the error vector magnitude (EVM) of the device under test 12.

In addition, a trigger line 36 is provided via which the vector signal analyser 16 can trigger the respective generation of the wideband modulated signal by the vector signal generator 14. Accordingly, a time can be provided at which the vector signal generator 14 starts its transmission. Alternatively, the vector signal analyser 16 is enabled to trigger a measurement start, thereby ensuring its readiness. The triggering generally ensures to determine absolute phase and/or group delay of the device under test 12.

Furthermore a communication interface 38 is provided between the vector signal generator 14 and the vector signal analyser 16. Via the communication interface 38, a frequency stitching can be coordinated appropriately provided that the vector signal analyser 16 and/or the vector signal generator 14 have/has a bandwidth that is lower than the span of the wideband modulated signal used for performing the respective measurement. Hence, the entire span can be separated into several bands that are transmitted in a consecutive manner, wherein the several bands are stepped through over time. The stepping and stitching can be coordinated among the vector signal analyser 16 and the vector signal generator 14 appropriately via the communication interface 38.

Generally, the vector signal analyser 16 may be established by a single-port vector signal analyser that has only a single port for receiving a signal to be analysed as shown in FIG. 1.

Nevertheless, the test system 10 is generally capable to perform multiple different measurements due to the fact that the switch module 18 has different switching positions that enable the vector signal analyser 16 to receive differently processed signals and even a non-processed signal, namely the reference signal.

As shown in FIG. 1, the first switch 24 as well as the second switch 26 of the switch module 18 each comprise three different switching positions such that the vector signal generator 14 is generally enabled to forward the wideband modulated signal to the input port 28 of the device under test 12, to the output port 30 of the device under test 12 or rather directly to the vector signal analyser 16 (via the second switch 26).

In a similar manner, the second switch 26 ensures due to its three different switching positions that the vector signal analyser 16 is enabled to receive different signals. For instance, a reference signal can be directly received from the vector signal generator 14 (via the switch module 18). Moreover, signals can be received that have been processed by the device under test 12 or rather reflected at the input port 28 or rather the output port 30 of the device under test 12.

In the switching position of the switch module 18 shown in FIG. 1, the test system 10 performs a $S_{21}$ measurement of the device under test 12, as the first switch 24 and the second switch 26 are set in their respective first switching position.

Thus, the wideband modulated signal generated by the vector signal generator 14 is forwarded to the input port 28 of the device under test 12 via the first switch 24 and the first directional element 20. The wideband modulated signal is processed by the device under test 12 and outputted via its output port 30, thereby providing a processed signal. The processed signal is forwarded via the second directional element 22 to the second switch 26 that is set in its first switching position to forward the processed signal to the vector signal analyser 16 for analysing the signal received, thereby performing the $S_{21}$ measurement of the device under test 12.

Generally, the respective switch module 18, namely the switches 24, 26, may be controlled such that they are set in different switching positions.

Accordingly, the wideband modulated signal may also be forwarded to the input port 28 of the device under test 12 via the first switch 24 and the first directional element 20, wherein electromagnetic waves reflected at the input port 28 of the device under test 12 are forwarded via the first directional element 20 and the second switch 26 in its second switching position to the vector signal analyser 16 for analysing the signal received, thereby performing the $S_{11}$ measurement of the device under test 12.

Further, the wideband modulated signal may be forwarded to the output port 30 of the device under test 12 via the first switch 24 in its second switching position and the second directional element 22, wherein electromagnetic waves reflected at the output port 30 of the device under test 12 are forwarded via the second directional element 22 and the second switch 26 in its first switching position to the vector signal analyser 16 for analysing the signal received, thereby performing the $S_{22}$ measurement of the device under test 12.

Moreover, the wideband modulated signal may be forwarded to the output port 30 of the device under test 12 via the first switch 24 in its second switching position and the second directional element 22. The wideband modulated signal is processed by the device under test 12 reversely and outputted via its input port 28, thereby providing a processed signal. The processed signal is forwarded via the first directional element 20 and the second switch 26 in its second switching position to the vector signal analyser 16 for analysing the signal received, thereby performing the $S_{12}$ measurement of the device under test 12.

Finally, the wideband modulated signal may be forwarded directly to the vector signal analyser 16 for analysing the signal received, wherein the respective switches 24, 26 are in their third switching positions.

As already mentioned, the switch module 18 is configured to enable the vector signal analyser 16 to perform different reflection measurements and transmission measurements at the ports 28, 30 of the device under test 12 depending on the respective switching position of the switch module 18.

Figure 2:
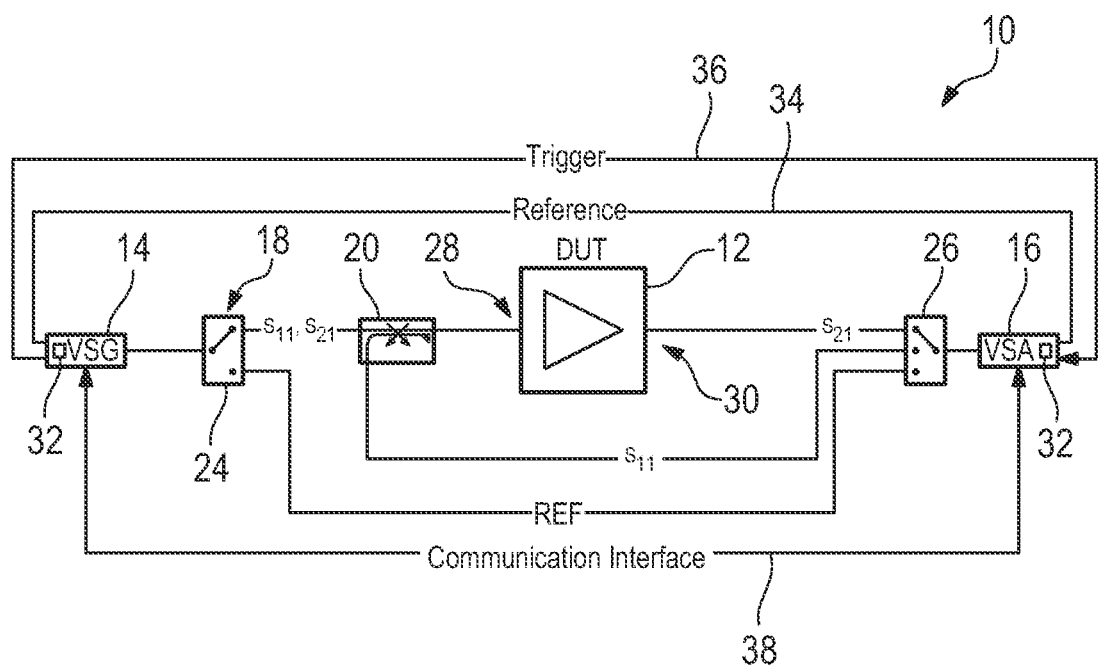
FIG. 2 schematically shows a representative overview of a test system according to a second embodiment of the present disclosure.

In FIG. 2, the test system 10 is shown in a second embodiment in which only the first directional element 20 is provided. Accordingly, it is not possible to direct the wideband modulated signal generated by the vector signal generator 14 towards the output port 30 of the device under test 12.

The test system 10 according to the second embodiment can only be used, for example, to perform scattering parameter measurements concerning the scattering parameters $S_{11}$ and $S_{21}$. In addition, a reference signal can also be transmitted by the test system 10 due to the fact that the switch module 18 comprises both switches 24, 26.

However, the first switch 24 in this embodiment has only two switching positions, as the wideband modulated signal is only forwarded to the device under test 12 via the first directional element 20 or rather directly to the vector signal analyser 16.

Figure 3:
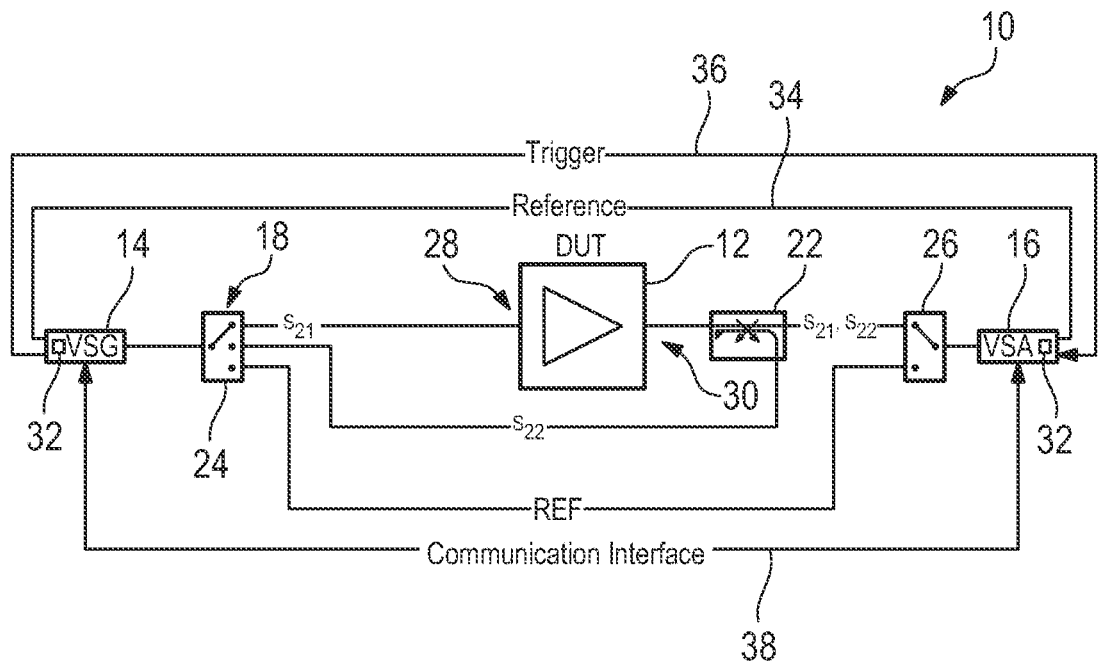
FIG. 3 schematically shows a representative overview of a test system according to a third embodiment of the present disclosure.

In FIG. 3, a third embodiment of the test system 10 is shown that uses the same components as the test system 10 shown in FIG. 2. However, the respective components have been arranged in different manner.

In some embodiments, the directional element has been connected with the output port 30 of the device under test 12 instead of the input port 28 such that the directional element becomes the second directional element 22.

In addition, the switches 24, 26 have been swapped with each other such that the first switch 24 becomes the second switch 26 and vice versa.

Therefore, the switch connected with the vector signal analyser 16 only has two switching positions, whereas the switch connected with a vector signal generator 14 has three different switching positions.

As shown in FIG. 3, the test system 10 according to the third embodiment can only be used, for example, to perform the scattering parameter measurements concerning the scattering parameters $S_{21}$ and $S_{22}$. Thus, the test system 10 shown in the configuration of FIG. 3 can be used to perform the measurements that were not possible with the configuration shown in FIG. 2.

Hence, the test system 10 as shown in FIGS. 2 and 3 correspond to two different configurations of the same test system 10, as the same components can be used, but in different arrangements, resulting in different measurements that can be performed by the respective test system 10.

Generally, the directional element and the switch module 18, for example the switches 24, 26, are detachably coupled with the respective components of the test system 10, thereby ensuring that different configurations can be used for testing purposes. Therefore, the directional element can be connected with either the input port 28 of the device under test 12 or the output port 30 of the device under test 12.

Figure 4:
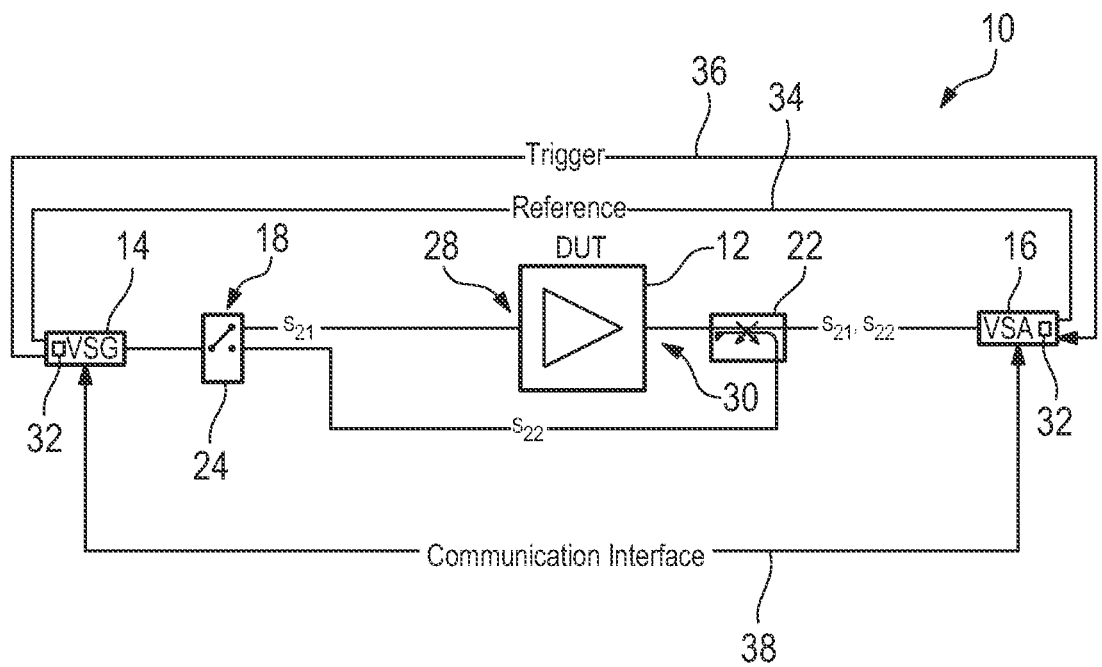
FIG. 4 schematically shows a representative overview of a test system according to a fourth embodiment of the present disclosure.

In FIG. 4, a fourth embodiment of the test system 10 is shown that comprises only a single directional element, namely the second directional element 22, that is connected with the output port 30 of the device under test 12 as well as only one switch 24 that establishes the switch module 18.

In any case, the switch module 18 is always connected with the vector signal generator 14, for example via the first switch 24 that however may establish the entire switch module 18.

Certain embodiments disclosed herein utilize circuitry (e.g., one or more circuits) in order to implement protocols, methodologies or technologies disclosed herein, operably couple two or more components, generate information, process information, analyze information, generate signals, encode/decode signals, convert signals, transmit and/or receive signals, control other devices, store information, etc. Circuitry of any type can be used. It will be appreciated that the term "information" can be use synonymously with the term "signals" in this paragraph.

In an embodiment, circuitry includes, among other things, one or more computing devices such as a processor (e.g., a microprocessor), a central processing unit (CPU), a digital signal processor (DSP), an application-specific integrated circuit (ASIC), a field-programmable gate array (FPGA), a system on a chip (SoC), or the like, or any combinations thereof, and can include discrete digital or analog circuit elements or electronics, or combinations thereof. In an embodiment, circuitry includes hardware circuit implementations (e.g., implementations in analog circuitry, implementations in digital circuitry, and the like, and combinations thereof).

In an embodiment, circuitry includes combinations of circuits and computer program products having software or firmware instructions stored on one or more computer readable memories that work together to cause a device to perform one or more protocols, methodologies or technologies described herein. In an embodiment, circuitry includes circuits, such as, for example, microprocessors or portions of microprocessor, that require software, firmware, and the like for operation. In an embodiment, circuitry includes one or more processors or portions thereof and accompanying software, firmware, hardware, and the like.

In some examples, the functionality described herein can be implemented by special purpose hardware-based computer systems or circuits, etc., or combinations of special purpose hardware and computer instructions.

Of course, in some embodiments, two or more of components described herein, or parts thereof, can be integrated or share hardware and/or software, circuitry, etc. In some embodiments, these components, or parts thereof, may be grouped in a single location or distributed over a wide area. In circumstances were the components are distributed, the components are accessible to each other via communication links.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A and B" is equivalent to "A and/or B" or vice versa, namely "A" alone, "B" alone or "A and B.". Similarly, the phrase "at least one of A, B, and C," for example, means (A), (B), (C), (A and B), (A and C), (B and C), or (A, B, and C), including all further possible permutations when greater than three elements are listed.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A test system for testing a device under test having at least an input port and an output port, said test system comprising:

a vector signal generator configured to generate a wideband modulated signal, a switch circuit having at least three different switching positions, said switch circuit being connected with said vector signal generator, a directional element configured to separate incident electromagnetic waves and reflected electromagnetic waves, said directional element being connected with said input port or said output port of said device under test, and a vector signal analyser configured to analyse a signal received, wherein said vector signal generator, depending on the respective switching position of said switch circuit, is connected with said input port of said device under test or said output port of said device under test such that, in a first switching position of said switch circuit, said wideband modulated signal generated by said vector signal generator is forwarded to said input port of said device under test and, in a second switching position of said switch circuit, said wideband modulated signal generated by said vector signal generator is forwarded to said output port of said device under test, wherein said switch circuit is configured to enable said vector signal analyser to perform reflection measurements and transmission measurements depending on the respective switching position of said switch circuit, wherein said switch circuit has a third switching position in which said vector signal generator is connected with said vector signal analyser such that a reference signal path is provided between the vector signal generator and the vector signal analyser, wherein the switch circuit is located within the reference signal path such that a reference signal is forwarded to the vector signal analyser provided that the switch circuit is set in the third switching position, wherein the reference signal is used to perform Error Vector Magnitude (EVM) measurements of the device under test, and wherein said switch circuit comprises two separately formed switches each having different switching positions, wherein a first switch is directly connected via a line with the vector signal generator and also assigned to the input port of the device under test, and wherein a second switch is directly connected via a line with the vector signal analyser and also assigned to the output port of the device under test.

2. The test system according to claim 1, wherein the reference signal is digitally transferred from said vector signal generator towards said vector signal analyser.

3. The test system according to claim 1, wherein said vector signal generator and/or said vector signal analyser comprises a memory.

4. The test system according to claim 1, wherein said vector signal analyser is configured to determine at least one scattering parameter associated with said device under test.

5. The test system according to claim 1, wherein said vector signal generator forwards said wideband modulated signal to said device under test via said directional element, said directional element being configured to separate an electromagnetic wave reflected at said input port of said device under test or said output port of said device under test.

6. The test system according to claim 1, wherein said test system has a first operation mode in which said vector signal generator forwards said wideband modulated signal to said input port of said device under test via said directional element, said directional element being configured to separate an electromagnetic wave reflected at said input port of said device under test.

7. The test system according to claim 1, wherein said test system has a second operation mode in which said vector signal generator forwards said wideband modulated signal to said output port of said device under test via said directional element, said directional element being configured to separate an electromagnetic wave reflected at said output port of said device under test.

8. The test system according to claim 1, wherein said switch circuit is detachably coupled such that said switch circuit is configured to be connected with said vector signal generator and said vector signal analyser.

9. The test system according to claim 1, wherein said directional element is detachably coupled such that said directional element is configured to be connected with either said input port of said device under test or said output port of said device under test.

10. The test system according to claim 1, wherein said test system comprises two directional elements, a first directional element being connected with said input port of said device under test, and a second directional element being connected with said output port of said device under test.

11. The test system according to claim 1, wherein said switch circuit comprises a first switch connected with said vector signal generator and a second switch connected with said vector signal analyser.

12. The test system according to claim 11, wherein said first switch is also connected with a first directional element connected with said input port of said device under test and/or wherein said second switch is connected with a second directional element connected with said output port of said device under test.

13. The test system according to claim 1, wherein a trigger line is established between said vector signal generator and said vector signal analyser.

14. The test system according to claim 1, wherein a communication interface between said vector signal generator and said vector signal analyser is provided.

15. The test system according to claim 1, wherein said test system is configured to perform an error vector magnitude measurement.

16. The test system according to claim 1, wherein said test system is configured to perform spur measurements and/or adjacent channel leakage power ratio measurements.

17. The test system according to claim 1, wherein the vector signal analyser is a single-port vector signal analyser.

18. A test system for testing a device under test having at least an input port and an output port, said test system comprising:

a vector signal generator configured to generate a wideband modulated signal;

a switch circuit having different switching positions, said switch circuit being connected with said vector signal generator;

a directional element configured to separate incident electromagnetic waves and reflected electromagnetic waves, said directional element being connected with said input port or said output port of said device under test, and a vector signal analyser configured to analyse a signal received, wherein said vector signal generator, depending on the respective switching position of said switch circuit, is connected with said input port of said device under test or said output port of said device under test such that, in a first switching position of said switch circuit, said wideband modulated signal generated by said vector signal generator is forwarded to said input port of said device under test and, in a second switching position of said switch circuit, said wideband modulated signal generated by said vector signal generator is forwarded to said output port of said device under test, wherein said switch circuit is configured to enable said vector signal analyser to perform reflection measurements and transmission measurements depending on the respective switching position of said switch circuit, and wherein said switch circuit comprises two separately formed switches each having different switching positions, wherein a first switch is directly connected via a line with the vector signal generator and also assigned to the input port of the device under test, and wherein a second switch is directly connected via a line with the vector signal analyser and also assigned to the output port of the device under test.

19. The test system according to claim 18, wherein at least one of the two separately formed switches has three different switching positions.

\* \* \* \* \*